United States Patent
Almogy

(10) Patent No.: US 6,208,751 B1
(45) Date of Patent: Mar. 27, 2001

(54) CLUSTER TOOL

(75) Inventor: Gilad Almogy, Givataim (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/046,607

(22) Filed: Mar. 24, 1998

(51) Int. Cl.⁷ ........................................................ G06K 9/00
(52) U.S. Cl. .......................................... 382/149; 382/152
(58) Field of Search ..................................... 382/141, 144, 382/145, 146, 147, 148, 149, 150, 151, 152, 153; 348/86, 87, 125, 126; 364/468.01, 468.02, 468.28; 438/14; 324/760, 500, 758

(56) References Cited

U.S. PATENT DOCUMENTS

| | | | |
|---|---|---|---|
| 4,618,938 | * 10/1986 | Sandland et al. | 382/148 |
| 4,764,969 | 8/1988 | Ohtombe et al. | |
| 5,614,837 | * 3/1997 | Itoyama et al. | 324/760 |
| 5,699,447 | 12/1997 | Alumot et al. | |

FOREIGN PATENT DOCUMENTS

| | | |
|---|---|---|
| 7822175 | 7/1997 | (DE) . |
| 96305154 | 12/1996 | (EP) . |
| 756316 | 1/1997 | (EP) . |
| 782175 | 7/1997 | (EP) . |
| 09252035 | 9/1997 | (JP) . |
| 9252035 | 9/1997 | (JP) . |

OTHER PUBLICATIONS

International Preliminary Examination Report PCT Application No.: US99/05910.

\* cited by examiner

Primary Examiner—Joseph Mancuso
Assistant Examiner—Vikkram Bali
(74) Attorney, Agent, or Firm—Sughrue, Mion, Zinn, Macpeak & Seas

(57) ABSTRACT

A cluster tool for testing substrates and locating defects on the substrates utilizing a plurality of tools coupled via an automation platform. The cluster tool includes an interface receiving storage device(s) having, each, more than one substrate contained therein. An inspection tool capable of inspecting the substrates and delivering defect map indicative of suspected locations on each of the substrates. The automation platform is coupled to the interface to the inspection tool, and to a review tool, and is capable of transferring substrates between the tools.

17 Claims, 7 Drawing Sheets

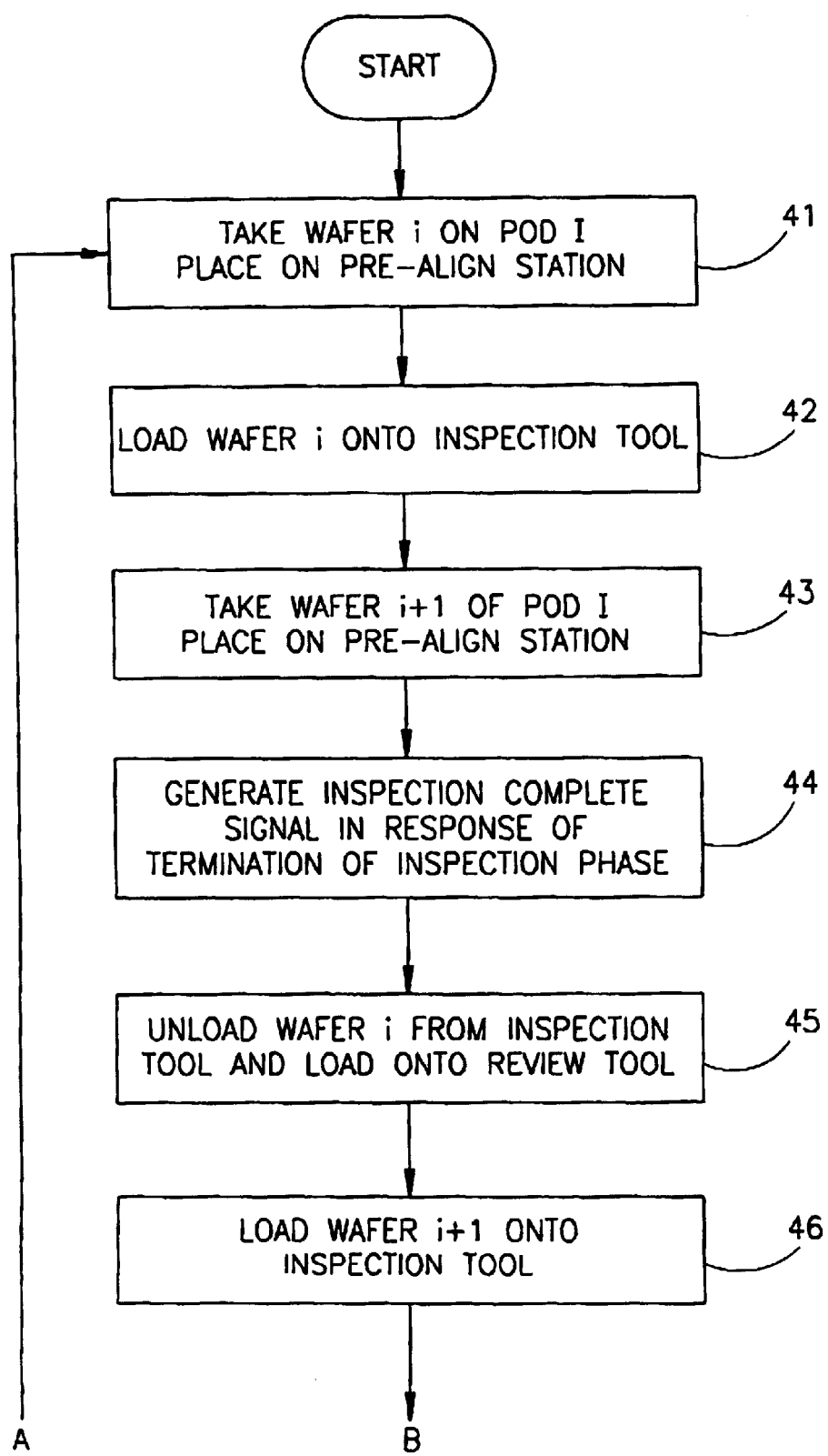

CLUSTER TOOL

FIELD OF THE INVENTION

The present invention is in the general field of inspection and review of wafers in a semiconductor fabrication installation (FAB).

BACKGROUND OF THE INVENTION

The rapid technology development in the IC industry leads to an ever increasing complexity in the IC structure and architecture, which obviously increases fabrication costs. At the same time, manufacturers are compelled to steadily reduce the wholesale prices of these manufactured chips due to the competitive nature of the IC market and the short life-span of the manufactured chips consequent to the introduction of new and more advanced designs to the market.

This situation has stimulated the development of a multitude of testing procedures in order to maintain a high so called yield score. "Yield", in this connection, relates to the percentage of dies produced in a batch which are fault-free in that no failures are detected by the completion of manufacture. Thus, from the point of view of manufacture, the yield criterion relates to the various design rules, process equipment, particle counts, process-induced defects, and IC sizes and densities. (It is assumed that the wafer material either contains local imperfections before the start of the fabrication process or acquires such imperfections during fabrication.) In some cases, a decrease of only a few percent in the yield score can make an otherwise profitable IC production line into a losing one.

Accordingly, it is customary to perform inspection and review of the wafers during production. Generally, the inspection is performed after critical steps in the manufacturing process, i.e., such steps that are known or prone to create defects. In the wafer inspection stage, an advanced inspection tool (e.g. WF-7xx series commercially available from Orbot Instruments Inc., Israel), scans the wafer under inspection and employs sophisticated computational techniques to map suspected defect locations on the wafer.

The map of defects, as delivered from the wafer inspection tool, is sent to a review tool, Generally comprising an optical or scanning microscope (SEM). The latter utilizes high resolution imaging in order to classify the mapped defects into either valid or false defects (e.g., locations marked suspect due to an overly high inspection resolution).

The inspection and review tools currently in use are the so-called "stand-alone" type. The "stand-alone" approach suffers from some significant shortcomings, the most prominent of which is "time to results." That is, the inspection phase is normally applied to a cassette of wafers and not to individual wafers. Thus, a cassette that includes a plurality of wafers, say 25, is loaded into the inspection tool for inspection. Only after the inspection tool completes inspecting all the wafer in the cassette (or has sampled a designated number of the wafers), the cassette is loaded into the review tool along with the computer file which includes the defect map. This results in slowing down the operation since an entire cassette (or the sampled wafers stored therein) must be inspected before the first wafer undergoes the review stage. It is generally known that such process takes, as a rule, over five hours.

Moreover, the additional handling of the cassette between the inspection and review stations is an additional source for defects. This mode of operation is referred to herein as "cassette inspection-review cycle."

Operation in cassette inspection-review cycle as well as the prolonged delay between the inspection and review stages (which often necessitates a dedicated, proficient operator for loading and unloading cassettes onto the inspection tool, physically conveys the cassettes and loads them into the review tool), significantly slows down the inspection-review cycle with the inevitable result of being delayed in the detection of faults in the wafers. Moreover, any additional defects introduced during the transfer of the cassette will not be documented, since the review station will review only location identified as suspect by the inspection tool. The recent introduction of pods that replace the conventional cassettes poses yet a further complication in carrying out the loading/unloading procedures as described above.

Another approach is described in U.S. Pat. No. 5,699,447, to Alumot which is assigned to the assignee of the present Application. In the cited patent, a system is described which enables a "per wafer" inspection and review. Specifically, an integrated system is described which comprises both an inspection and review capabilities in a single tool. Thus, a cassette is loaded and the first wafer enters the system. The system first performs an inspection routine and creates a defect map. Without ejecting the wafer, the system then proceeds to the review routine in an increased magnification and/or sensitivity using the created defect map.

It should be appreciated that, in the stand-alone mode of operation, the inspection and review phases can be activated simultaneously in a pipe-line approach. Thus, when the review phase is conducted in respect of a first wafer from one cassette, a different wafer from a different cassette can undergo the inspection phase simultaneously. In contrast, the "integrated" tool is characterized by a serial mode of operation. In other words, when an already inspected wafer is processed in the review module, the corresponding inspection module is put on a stand-by mode. From a cost perspective, if a single wafer is inspected for 8 minutes in a high-end $2 million worth inspection module and is then subject to review for a period of T seconds (T=I*N, N standing for the number of defects that were revealed in the inspection phase; I standing for the review period of a defect, in seconds) in a $400,000 worth review module (say, an optical microscope), it readily arises that for say, 200 defects (i.e. N=200) and I=3, the very expensive inspection module is put on standby for 10 minutes, during which more than one wafer could have been inspected. This is a very significant limitation which, in many FAB's, is unacceptable.

Moreover, the known "integrated" systems are characterized in an inflexible configuration in the sense that the integrated systems comprise inspection and review tools of the same type, generally optical microscopes. Thus, the review is enabled simply by increasing the magnification and/or sensitivity of the system. This is basically similar to the known method of using a lab microscope, wherein the subject is first acquired using low magnification, and then inspected using higher magnification simply by rotating an objective lens turret having lenses of various magnifications.

However, it should be appreciated that many times simply increasing the magnification is insufficient and, indeed, it is customary to follow up an inspection in such an "integrated" system by using an additional tool of a different character, such as an SEM. The inflexible configuration constitutes, thus, significant shortcomings.

There is, accordingly, a need in the art to provide a tool for inspection and review of wafers which substantially reduces or overcomes the drawbacks associated with stand-alone inspection review sequence and with hitherto known "integrated" systems.

SUMMARY OF THE INVENTION

For simplicity, the description below predominantly focuses on a cluster tool that includes an inspection tool and a review tool. Those versed in the art will readily appreciate that the invention is by no means bound to this specific configuration. Thus, by way of non-limiting example, the invention is likewise applicable to a cluster tool that embodies two or more inspection tools or inspection tool and metrology tools.

The present invention aims at benefiting from the advantages of both the "integrated" tool approach and the stand alone mode. Thus, on the one hand, in accordance with the integrated approach, the interface between the inspection and review stages is simplified so as to reduce the overall duration of the inspection review cycle, and on the other hand, benefiting from the pipeline operation of the stand alone mode and conferring a high level of architectural flexibility. Flexibility, in this context, enables the treatment of each component separately, e.g. replacing either or both of the inspection and review components, in order to improve compatibility or essentially match the respective throughputs of the inspection and review tools by adding one or more review tools or inspection tools, all as required and appropriate.

Accordingly, the overall duration of the inspection-review cycle will be reduced whilst offering a high level of compatibility between the inspection and review stages, as stipulated by the specific application.

Generally speaking, according to the invention, an inspection metrology tool such as the specified WF-7xx series, is utilized for delivering a defect map. An automation platform is coupled to the inspection tool as well as to selected review tools. The automation platform is capable if automatically loading wafers from a cassette or pod into the inspection tool and, upon completion of the inspection phase, unloading it from the inspection tool and conveying it to the review tool for the review phase. The automatic procedure, in the manner specified, drastically reduces the "time to results" and saves an undesired overhead that is associated with the lengthy and error prone equivalent manual procedure as described above.

In contrast to the hitherto known cassette inspection-review cycle, the system of the invention provides for a "per wafer" or "single wafer inspection-review cycle" which drastically reduces time to results. More specifically, according to the prior art, one is compelled to wait until all the wafers in the cassette (or, alternatively, an entire sample thereof) are inspected and loaded into the review tool in order to obtain the report of defects and malfunction. In contrast, according to the invention, after an individual wafer has been inspected, it is conveyed and loaded into the review tool (along with the relevant defect maps—which may, if desired, be unified into a single map representation), and a succeeding wafer from the same cassette is simultaneously loaded to the inspection tool. Thus, the report of possible defects and malfunctions in an individual wafer is already available once its review stage has been completed, and the need to wait for the report until the remaining wafers undergo inspection, is obviated.

The single wafer inspection-review cycle and the flexibility of the architectural design to suit the specific requirements of the application reduces the time required to obtain information as to defects and malftinctions in an individual wafer. Advancing the time that this information is available in the manner specified, correspondingly advances the application of preemptive actions (such as halting the production line re-configuring the manufacturing tools, changing reticles and so on), which eventually accomplish improved yield. Considering the requirements of a very high yield that the present IC technology poses in order to render production line profitable, it is readily appreciated that from a cost perspective, utilizing the system of the invention constitutes a significant advantage, especially in the "ramp-up" stage Accordingly, by one aspect, the invention provides for a cluster tool for testing substrates and locating defects on the substrates utilizing a plurality of tools coupled via an automation platform, comprising:

an interface receiving storage media, each having a plurality of substrates contained therein;

an inspection tool inspecting the substrates and delivering defect maps indicative of suspected locations on each of said substrates;

at least one of a second tool selected from the group of inspection tool metrology tool and a review tool;

the automation platform coupled to said interface, said inspection tool, and to the at least one of the second tool , and transferring substrates between the tools;

wherein each of said inspection tool and second tool includes a stage for supporting said substrate.

By another aspect the invention provides for a cluster tool for testing substrates and locating defects on the substrates utilizing a plurality of tools coupled via an automation platform, comprising:

an interface receiving storage media, each having a plurality of substrates contained therein;

an inspection tool inspecting the substrates and delivering defect maps indicative of suspected locations on each of said substrates;

at least two of a second tool selected from the group of inspection tool, metrology tool, and a review tool; and the automation platform coupled to said interface, said inspection tool, and to the at least two of the second tool, and transferring substrates between the tools according to at least one escalation criterion.

The architectural flexibility of the invention facilities utilization of an "escalated" mode of operation. In a typical, yet not exclusive, example of the latter, a single inspection tool and two review tools are utilized. The first review tool e.g. an optical microscope, having a low review resolution, serves for a first coarse review and classification of the mapped defects that were delivered from the inspection tool. A succeeding, and more accurate review tool, e.g. a SEM, is configured for the review and classification of only those defects that were not classified by the optical review tool and which require a higher review resolution.

As will be explained in greater detail below, the utilization of escalation in the manner specified constitutes advantages insofar as the accomplished e.g. "level of confidence" and "defect size-based Escalation" strategy are concerned.

BRIEF DESCRIPTION OF THE DRAWINGS

For a better understanding the invention will now be described, by way of example only, with reference to the accompanying drawings in which:

FIGS. 3A–3B are consecutive flow charts showing a succession of computational steps that control the inspection-review cycle, according to one embodiment of the invention;

DETAILED DESCRIPTION OF A PREFERRED EMBODIMENT

In the context of the invention, "storage medium" encompasses any means for storing substrates (e.g. wafers), such as a cassette, pod, etc.

Figure 1A:
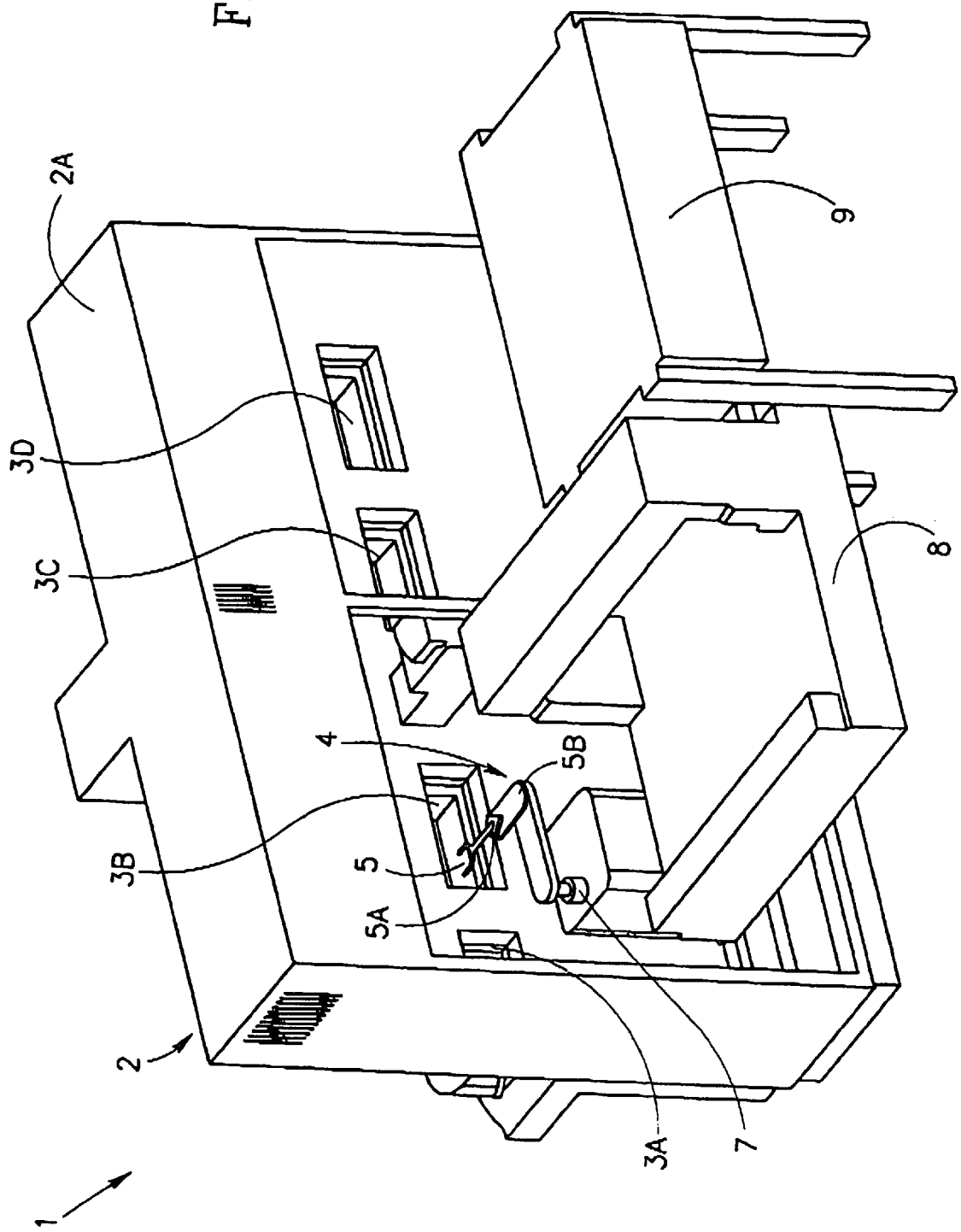
FIGS. 1A–1B illustrate two perspective views of a cluster tool according to one embodiment of the invention.
Figure 1B:
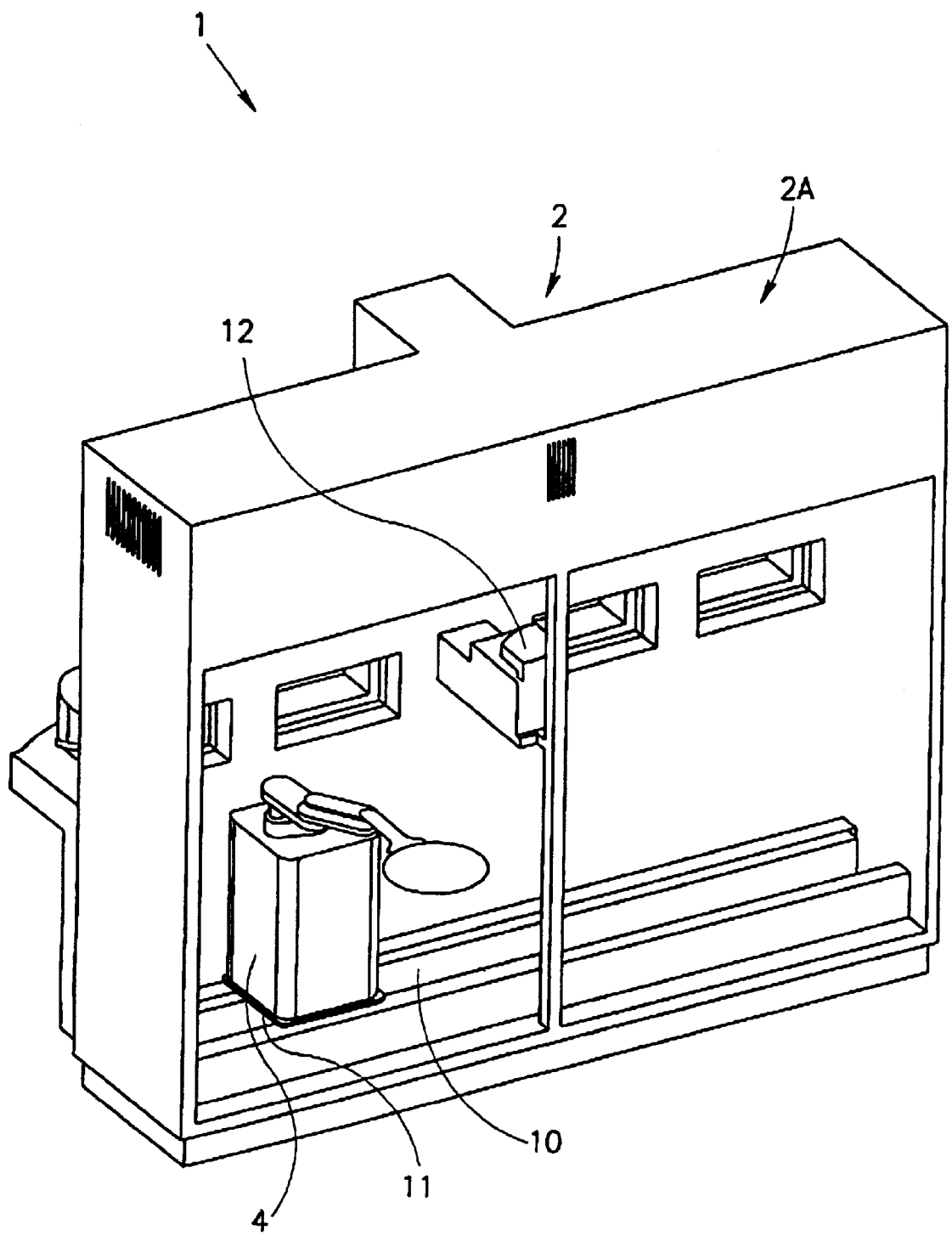

Attention is first directed to FIGS. 1A–B showing a perspective views of a cluster tool according to one embodiment of the invention. Thus, cluster tool (1) includes an automation platform (2) having an enclosure (2A) accommodating four pods (not visible), each of which is capable of holding a plurality of wafers. In FIG. 1A, only the openings in enclosure (2A) which accommodate each pod (designated 3A–3D, respectively) are shown. Enclosure (2A) may form a "mini environment" for controlling the proper level of cleanliness (e.g. cleanroom ambient of class 10 and mini environment at class 0.01) using directed air flow and scrubbers, etc. For enclosure (2A) one may use a SMIF-300 WMS available from Asyst Technologies. See also Minienvironment System for 300 mm Wafer Manufacturing, Alfred Honold and Werner Scheler, available at www.fabtech.org.

Also shown in FIG. 1A is a robot (4) having arm (5) with two step motors (not shown) driven members having two degrees of freedom about hinges 5a and 5b so as to accomplish horizontal angular movement. Arm (5) is capable of vertical movement by means of motor controlled arm (7) capable of elevating or lowering the arm, all as required and appropriate.

Robot (4) rides on track 10 (FIG. 1B), which is installed inside enclosure 2A. Suitable robot and track can be obtained from Equipe Technologies of Sunnyvale, Calif. Also shown in FIG. 1A is a constituent (8) forming part of an inspection tool and a constituent (9) forming part of a review or metrology tool. The inspection tool and review/metrology tool are presented only in a symbolic manner in FIGS. 1A–B in order to reveal the structure of the automation platform and the arm robot. FIG. 1B is identical to FIG. 1A except for the fact that the inspection and review tools constituents are removed to thereby reveal track (10) which enables the robot base (11) slide thereon in order to reach a desired position vis-a-vis the inspection and/or review tools, as will be explained in greater detail below. The automation platform further accommodates pre-align station (12) that serves for aligning the wafer before it is loaded to the inspection tool.

As shown in FIGS. 1A and 1B, arm (5) reaches through openings 3A–3D and retrieves a wafer from a respective pod. Then arm (5) loads the wafer onto the inspection tool. Albeit not shown in FIGS. 1A and 1B, the loading is implemented in this embodiment by placing the wafer on a chuck, such as electrostatic or vacuum activated chuck. The operation of the automation platform will be explained below with references to FIG. 4, but it should be noted, already at this stage, that the configuration of the cluster tool is by no means bound to the specific embodiment of FIGS. 1A and 1B. The latter serves for illustrating only one out of many possible configuration for realizing a cluster tool of the invention. Likewise, a track automation platform that includes robot (4) track (10) and pre-align station (12) is only one out of many possible variants of an automation platform of the invention.

Figure 2:
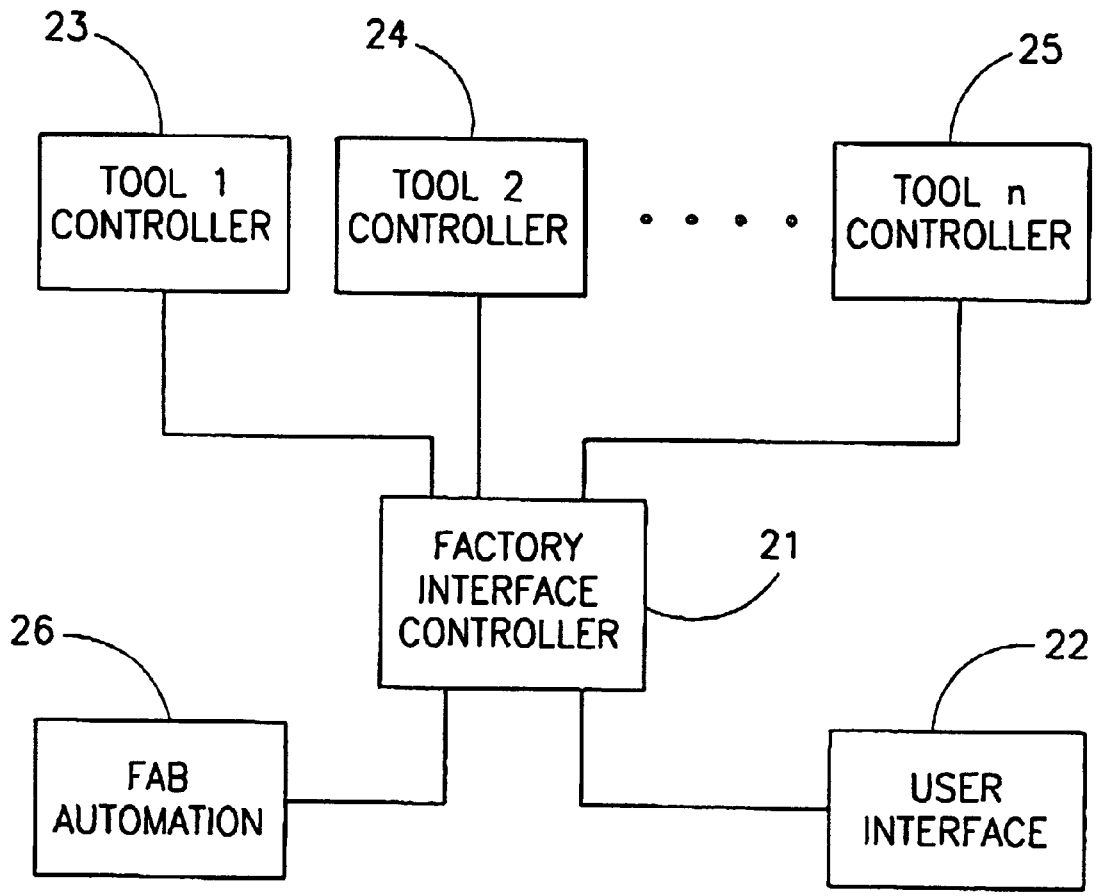
FIG. 2 illustrates hardware architecture employed in a cluster tool, according to one embodiment of the invention.

Turning now to FIG. 2, there is shown an exemplary hardware architecture employed in a cluster tool, according to one embodiment of the invention. Thus, a factory interface controller (21) serves as an interface between the tools and the FAB. A connection is provided to a user interface (22) for communicating with the operator. The factory interface controller (21) is coupled to tool 1 controller (e.g., an inspection tool) (23), To tool (2) controller (e.g., as first review tool) (24) and to tool n controller (e.g., a metrology tool) (25), by means of a local area network, LAN e.g. Ethernet. The factory interface controller (21) further communicates with a FAB automation host (26) that, inter alia, governs the overall inspection-review cycle through e.g. Ethernet LAN. Those versed in the art will readily appreciate that FIG. 2 illustrates only one out of many possible variants for realizing the hardware architecture employed in a cluster tool, according to the invention.

Figure 3B:
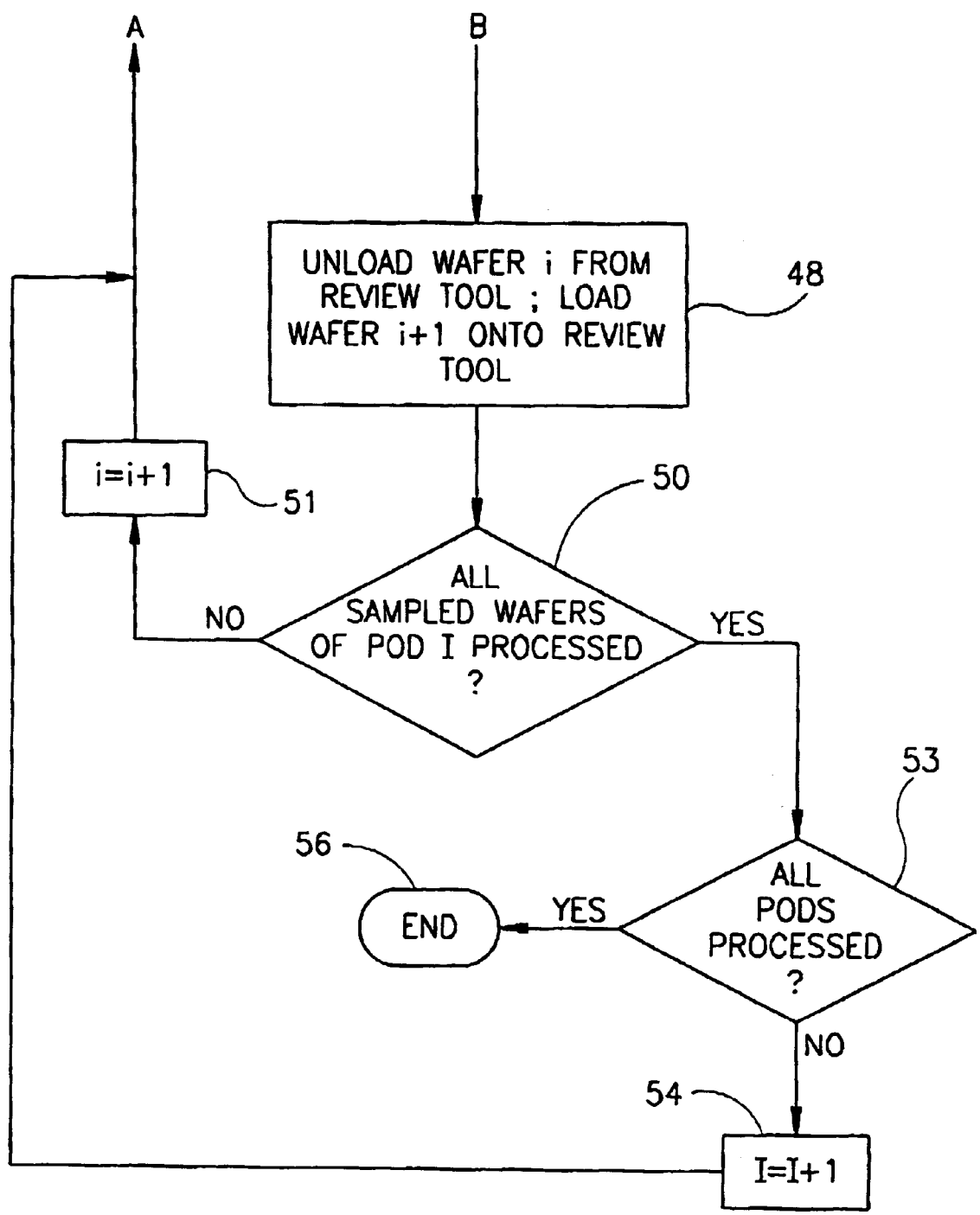

Moving on to FIGS. 3A–B, there is shown a flow chart of exemplary steps that control the inspection-review cycle, according to one preferred embodiment of the invention. At the onset, wafer #1 of pod #1 is taken by the robot arm of the automation platform (41) and is placed at a pre-align station that serves as preparatory stage loading wafer #1 into the inspection tool (42). While inspection tool is inspecting wafer #1, wafer #2 may be taken by the arm (from pod #1) and placed in the pre-align station (43). When the inspection phase of wafer #1 terminates an appropriate inspection completion signal is generated (44). In response to the specified signal, wafer #1 is unloaded from the inspection tool and is loaded onto the review tool (45). Next, while the review tool performs inspection of wafer #1, wafer #2 is loaded onto the inspection tool for inspection (46).

Now wafer #2 is inspected in the inspection tool and wafer #1 is reviewed simultaneously by the review tool. Wafer #3 is now taken from pod #1 and is placed in the pre-align station (not shown). If the duration of the inspection and review phases are essentially the same (constituting thus an essentially matched throughput), review of wafer #1 will be completed in time for loading wafer #2 onto the review tool. Thus, upon completing the review of wafer #1, it can be returned to pod #1 or moved to a second review tool or to a metrology tool, and wafer #2 may be loaded onto the first review tool (48). Wafer #3 can now be loaded onto the inspection tool not shown.

The specified procedure (steps 41 to 48) is repeated until all the sampled wafers from pod #1 are processed (50 and 51). In the case that all wafers in pod #1 were processed, the procedure is repeated in respects of all pods that accommodate wafers being subject to the inspection review cycles (53, 54), otherwise (i.e. all pods were processed) the process terminates (56).

Those versed in the art will readily appreciate that FIGS. 3A–B illustrate only one out of many possible variants. An exemplary list of possible modifications (which, of course, necessitate mutatis mutandis changed in the procedure of FIGS. 3A–3B), includes:

i. an automation platform that utilizes two robots or a dual-arm robot;

ii. elimination of the pre-align station;

iii. the matched throughput assumption does not prevail;

iv. use of more than one inspection tool and/or more than one review tool;

Other modifications may be applied, all as required and appropriate depending upon the particular application.

Notably, for matching throughput, more than one review tool may be positioned to serve a single inspection tool, or vise versa. Alternatively, the review tool may only sample the suspect locations indicated in the defect map/s of the inspection tool. Alternatively, the system can be utilized to increase inspection throughput by utilizing more than one inspection tools working in parallel. Furthermore, as noted above, in addition to or instead of the review tool one may use a metrology tool, such as atomic force microscopy, near field optical microscopy, scanning tunneling microscopy, etc.

Figure 4:
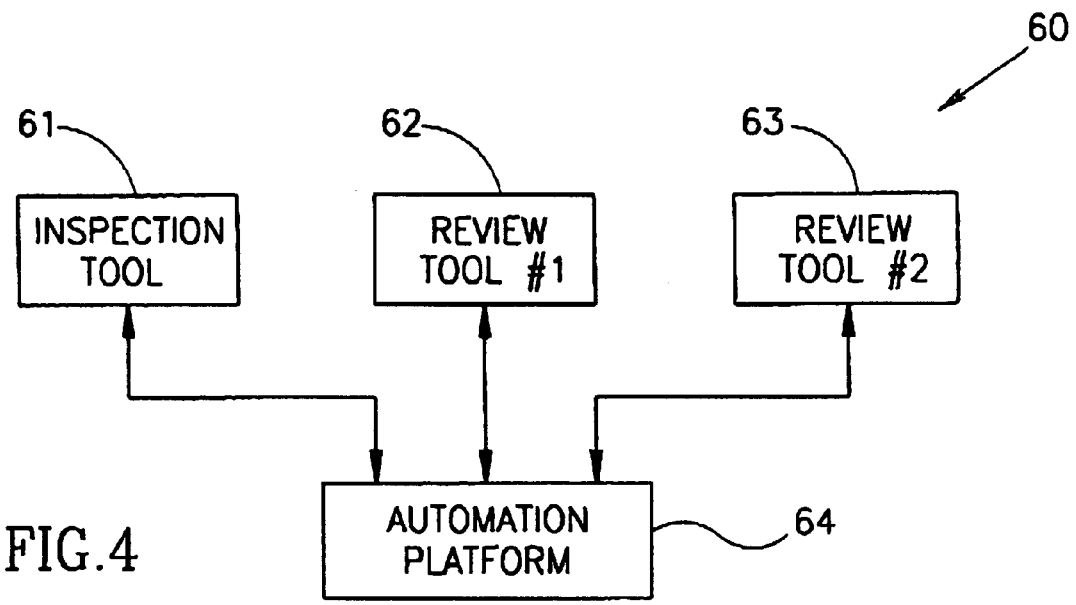
FIG. 4 is a schematic illustration of an "escalation" configuration, according to one embodiment of the invention.

Attention is now directed to FIG. 4, showing a schematic illustration of an escalation configuration, according to one embodiment of the invention. As shown, cluster tool (60) includes inspection tool (61) and two inspection tools (62) and (63). Thus, for example, review tool (61) comprises an optical microscope. Review tool (62) may be a more sensitive optical microscope, having a higher magnification than (61). Review tool (63) may be a SEM serving for examining thoroughly defects of interest from among to those that were reviewed by review tool (62), or, if desired, for examining those defects which require high resolution, beyond the operational specification of review tool (62).

Such an arrangement is especially advantageous when it is desired to classify the defects during the inspection-review cycle. Thus, the inspection tool may provide a "first pass" coarse classification of the defects. Using that classification, the system may determine a review strategy. For example, if scratches are of no interest at that particular processing stage, then all suspect locations classified as possible scratch may be skipped during the review process. On the other hand, if certain defects are of great interest, such as cleanliness of contacts and vias, these defects can be skipped by the first review tool (62) and reviewed only by the highly sensitive review tool (63).

The configuration of FIG. 4 may also serve, e.g. for matching throughputs where the throughput of inspection tool (61) exceeds any of the review tools (62) and (63) separately, but is nevertheless of similar throughputs when utilizing both review tools (62) and (63).

The utilization of the escalation embodiment in the manner specified may be utilized for enhancing confidence level. Thus, for example, a specific escalation criterion (constituting confidence level escalation criterion) may dictate that all wafers are first inspected by an inspection tool. According to this specific escalation criterion, those defects identified by the inspection tool are subject to a first (coarse) review tool. Those defects which are found to be below the desired level of confidence are subject, according to this escalation criterion, to another (more refined) review, e.g. utilizing a SEM-based tool. According to a different strategy a Size-based Escalation criterion is utilized. Thus, for example, defects that are determined by the inspection to be large are sent to optical review tool capable of analyzing relatively large defects. Those that are determined to be small are sent to a SEM-based review tool capable of analyzing relatively small defects. Whilst the latter examples exhibited only two out of many possible escalation criteria, they nevertheless illustrated the flexibility in designing an inspection review combination. Those versed in the art will readily appreciate that the configuration of FIG. 4 is only an example and may be adjusted, e.g. by adding new inspection and/or review and/or metrology constituents, or by replacing existing ones. As to the latter case, it is readily understood that the review tools are not bound to specific types, such as optical microscope or to SEM, and accordingly other constituents may be utilized, e.g. any known ion beam inspection and review tools, and/or atomic force, near field, scanning tunneling microscopes. For a selected escalation embodiment, a suitable escalation criterion is used, all as required and appropriate, depending upon the particular application.

Those versed in the art will readily appreciate that whilst the utilization of automatic platform was demonstrated in respect of "inspection-review cycle," it may, likewise, be exploited in other stages of the IC manufacturing process. Thus, for example, a different, known per-se, manufacturing stage involves processing of a wafer in an inspect, overlay, Macro, and CD-SEM modules (designated in FIG. 5A as 70,71,72, and 73, respectively). Similar to the inspection-review process described above, also the manufacturing stage described in FIG. 5A necessitates moving of the wafer from one station to the other. Accordingly, an automation platform (designated schematically as 74) may be exploited in order to reduce overhead that is associated with conveying the wafer from one station to the other. The automation platform is, obviously, designed to meet the specific requirements posed by the embodiment of FIG. 5A which include wafer loading/receiving station for each one of the specified modules. However, in the preferred embodiment the automation platform and the various tools are designed to allow for "open architecture," by which any tool can be connected to the automation platform, regardless of the tool's purpose, operation, and manufacturer.

Figure 5A:
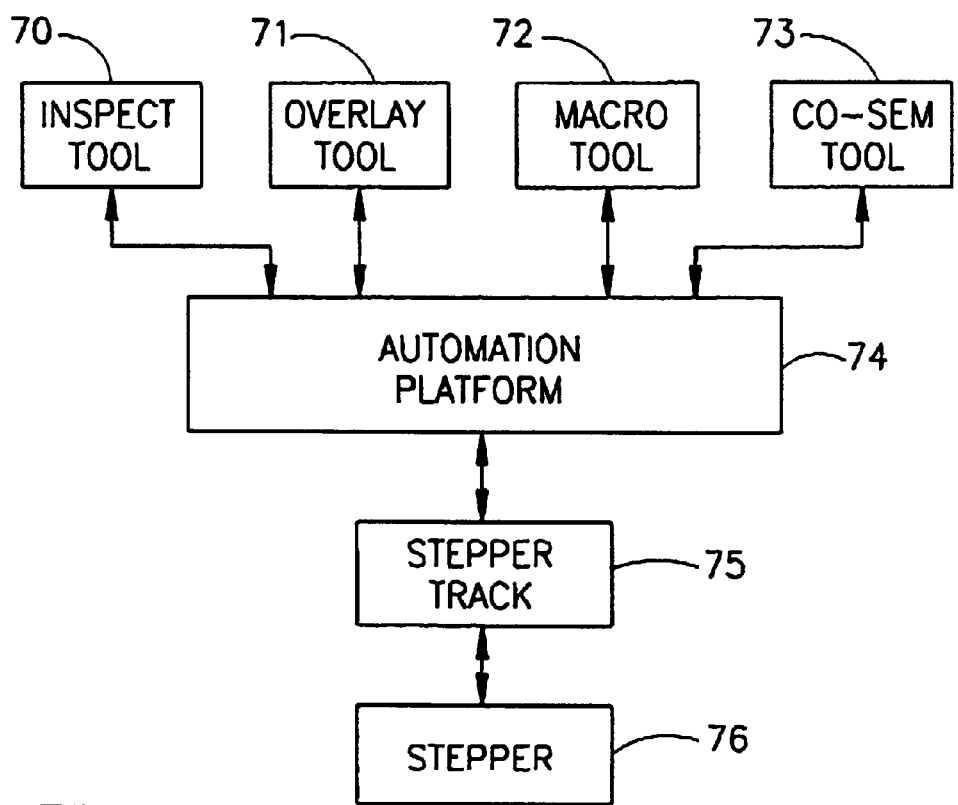
FIGS. 5A–5B are two schematic illustrations of overlay configuration, according to one embodiment of the invention.

FIG. 5A farther illustrates another embodiment where the known per se Track and Stepper stages (75 and 76) are also utilized, thereby obviating the need to return the wafer into the wafer pods between processing, metrology and inspection stages. As shown, the wafers are loaded to wafer loading station and therefrom they are subject to the stepper/track module and therefrom, utilizing the automation platform, they are processed in modules (70), (71), (72), and (73).

Figure 5B:
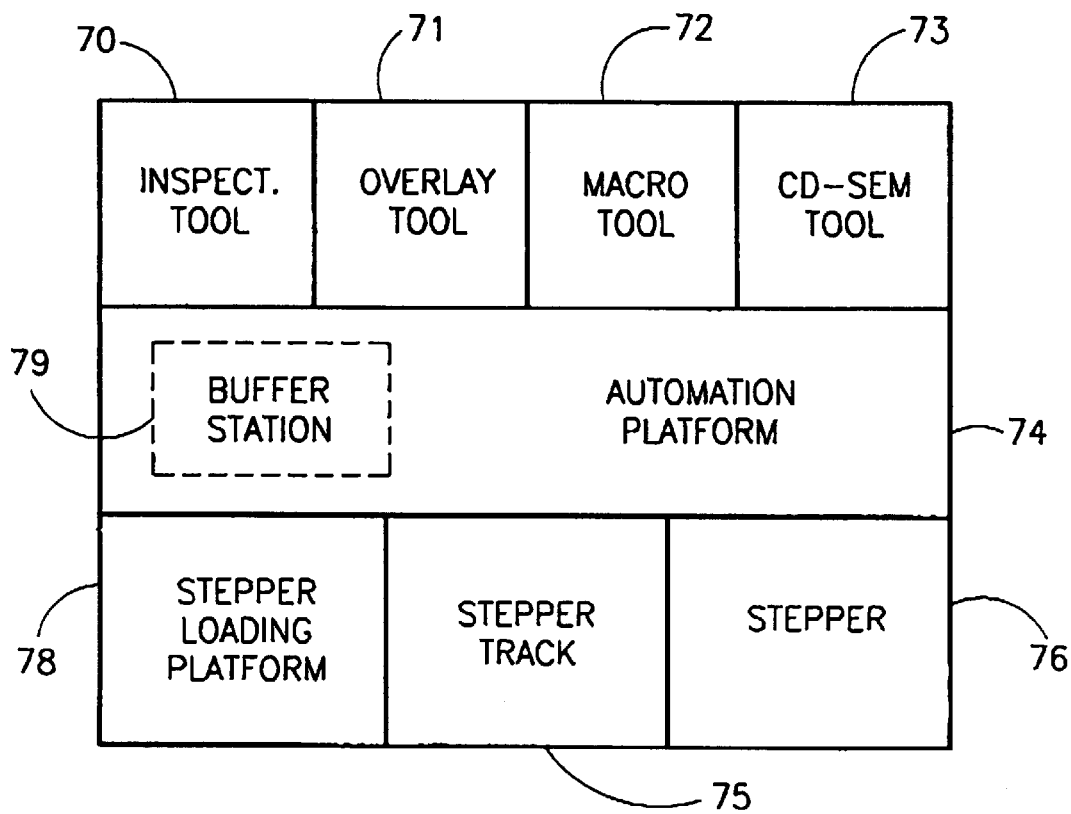

FIG. 5B illustrates one embodiment for implementing the stepper track-cluster tool arrangement of FIG. 5A. It is a current trend in the industry to build the stepper track vertically rather than horizontally. Thus, state of the art stepper tracks are no longer elongated horizontally, but rather in the form of substantially square footprint with various stations stacked vertically. Thus, the current trend is to have the stepper track stationed in between the stepper and a loading station (the stepper track has its own robot capable of vertical as well as horizontal motion).

Thus, according to this embodiment and as shown in FIG. 5B, the automation platform (74) of the cluster tool abuts the loading station (78) of the stepper track (75). An advantage of such an arrangement is that it may save on footprint. On the other hand, it may make access to the stepper track and stepper more cumbersome. In order to simplify operations, and perhaps provide more room for access to the stepper track, an optional buffer station (79) may be placed between the stepper loading station and the automation platform. The buffer station (79) may be placed inside the enclosure of either the stepper loading platform (78) or the automation platform (74), so as to provide a common mini-environment. Thus, rather than handing a wafer directly to the automation platform robot, the loading station of the stepper track may place the wafer on the buffer station (79), and the robot of the automation platform (74) would pick the wafer from the buffer station. Such an arrangement will enable having a passage between the automation platform (74) and the stepper track (75) to provide access for service and repair.

It should be noted that, in the arrangement of FIG. 5B, the automation platform (74) can be simplified, in that it need not have the mechanism to accept and service pods. Rather, such mechanism may be provided only on the stepper loading platform (78), which would handle all servicing of the pods. Consequently, the automation platform (74) may comprise simply of a track robot and, if needed, mini-environment equipment.

Figure 6:
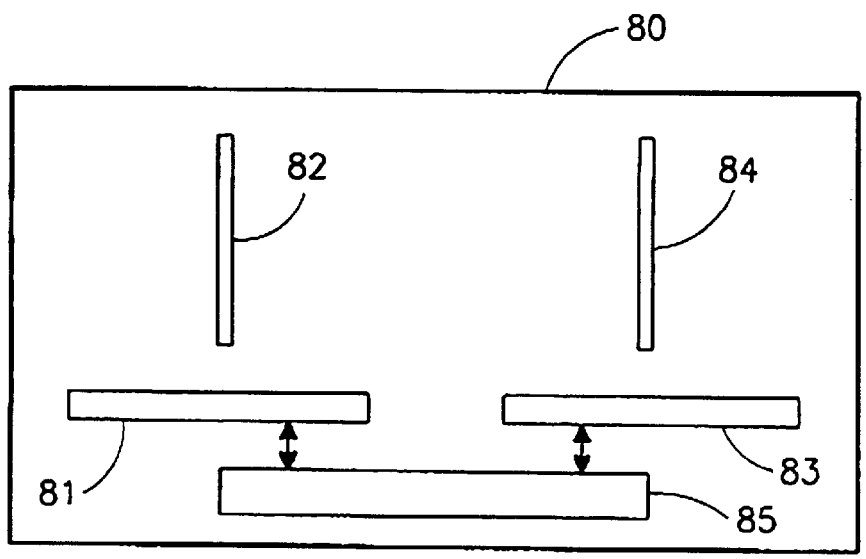
FIG. 6 is a schematic illustration of a cluster tool configuration according to another embodiment of the invention.

Attention is now directed to FIG. 6 which illustrates another non-limiting arrangement of automation platform that can be utilized in a cluster tool of the invention. As shown in FIG. 6, a review tool and inspection tool are both accommodated within a single chamber (80) and do not constitute separate tools. The inspection tool is presented for simplicity as stage (81) and inspection device (82), and the review tool is, likewise, presented, as stage (83) and review device (84). Stage (81) is adapted to receive wafer for inspection and stage (83) is adapted to receive wafer for review. (Of course, the invention is by no means bound by neither any specific structure of the stage, nor by the manner in which the substrate is supported). Since, however, both the review and inspection reside in the same chamber the necessity to slide the robot along track as is the case in the specified Track robot is obviated. Thus, according to the specific embodiment of FIG. 6, the automation platform (designated schematically as 85) is designed to meet the requirement to loading and unloading wafers from stages (81) and (83).

Those versed in the art will readily appreciate that the flexible configuration of a cluster tool according to the invention encompasses also the specific configuration where tool (80) of FIG. 6 replaces member (8) in FIG. 1 (i.e. for inspection and low sensitivity review) and tool (9) serves for high sensitivity review.

One possible application of the invention is to alleviate the time consuming tuning procedure that is applied in various wafer inspection phases. As is well known, different levels of inspection sensitivity are required during different manufacturing stages. Thus, for example, post Chemical-Mechanical-Planerization (CMP) inspection phase imposes different inspection sensitivity than, say, post etching phase. The tuning phase that is applied in order to reach the desired sensitivity level is not only burdensome but also time consuming and may extend over 3 hours. Thus, assuming that the inspection tool has been set for a given inspection sensitivity level, it is absolutely necessary to ascertain that an overly sensitive set-up has not been applied. In the latter case, the inspection may result in reporting on many faulty defects (i.e. fault-free wafer locations that are reported as bearing defects) which is obviously undesired. On the other hand, setting an undue insensitive level may result in overlooking defective locations in the inspected wafer with the undesired consequence that defective wafers are moved to succeeding processing stations rather than being discarded, or even distributed to the marketplace (in the form of capsulated dies).

According to the prior art, in order to cope with the overly sensitive configuration a tuning phase is applied during which the inspected wafer (with its associated report list of inspected defects) is loaded onto review tool which verified or refutes the defect indications of the inspection tool. If it turns out that the rate of faulty defects is too high, the wafer is returned to the inspection tool and the procedure is repeated until the desired level of accuracy is accomplished.

As explained above, moving the wafers from the inspection tool to review tool and vise versa according to prior art techniques is a prolonged and error prone procedure. If, however, the cluster tool of the invention is employed the tuning phase which requires as a rule few inspection-review cycles is accelerated and is rendered more accurate.

It should be noted that, in general the automation platform operates at much higher speed than each of the inspection/review/metrology tools' throughput. Thus, it should be apparent that the automation platform can be programmed to feed each of the inspection/review/metrology tools independently. That is, the factory interface controller (FIG. 2) can be programmed to serve as a central loading station for each of the tools connected to it, while each of the tools is being operated as a stand alone tool. This option provides more flexibility for the FAB operator.

Specifically, it may be that for certain operations the FAB operator may decide not to run the cluster tool in a pipeline mode, but rather use certain or all of the tools of the cluster independently of the others. For example, if the cluster tool comprises an optical inspection tool and a SEM tool, the factory interface can be programmed to control the robot to feed each of the inspection and SEM tools individually and independently of the operation of the other tool.

Another advantage of such a feature is in case of a machine down time. If, for example, one of the tools comprising the cluster needs to be taken off line for maintenance or repair, the cluster tool can still be operational by programming the factory interface controller to feed the various tools according to a different schedule. The current thinking in the industry is that a review tool should serve more than one inspection tool, generally in the ratio of up to 4 inspection stations served by one review station. Assuming for illustration purposes that the cluster comprises three inspection stations and one review station, the factory interface controller can be programmed to feed the review station from one, two, or three inspection stations, depending on how many stations are operational and on the desired throughput.

The present invention fulfills, thus, a long felt need.

The present invention has been described with a certain degree of particularity but it should be understood that various modifications and alterations may be made without departing from the scope or spirit of the invention as defined by the following claims:

What is claimed is:

1. A cluster tool for testing substrates during a production process after critical steps in manufacturing and locating defects on the substrates utilizing a plurality of tools coupled via an automation platform, comprising:

an interface receiving storage media, each having a plurality of substrates contained therein;

an inspection tool inspecting the substrates and delivering defect maps indicative of suspected defect locations on each of said substrates, wherein the defect location includes defect information;

at least one of a second tool selected from the group of inspection tool, metrology tool and a review tool;

the automation platform coupled to said interface, said inspection tool, and to the at least one of the second tool, and transferring substrates between the tools, said automated platform being moveable to a plurality of stations and being operative to deliver and deposit a first wafer for inspection by one of said tools and operative during said inspection of said first wafer to simultaneously retrieve a second wafer; and an adjustment tool which adjusts the production line, wherein each of said inspection tool and second tool includes a stage for supporting said substrate and wherein defect information is provided in real-time to allow adjustment of the production line to improve yield.

2. The cluster tool of claim 1, wherein said testing of substrates in said tools is performed in a pipeline manner and wherein a single wafer cycle is obtained.

3. The cluster tool according to claim 1, wherein said automation platform includes a track robot.

4. The cluster tool of claim 1, wherein said storage media being of a cassette type.

5. The cluster tool of claim 1, wherein said storage media being of a pod type.

6. The cluster tool of claim 1, wherein said inspection tool and at least one from among said second tools are accommodated within a common chamber.

7. The cluster tool of claim 1, wherein said automation platform is further coupled to at least one third tool selected from the group that includes overlay tool, macro tool and stepper track.

8. A cluster tool for testing substrates during a production process after critical steps in manufacturing and locating defects on the substrates utilizing a plurality of tools coupled via an automation platform, comprising:

an interface receiving storage media, each having a plurality of substrates contained therein;

an inspection tool for inspecting the substrates and delivering defect maps indicative of suspected defect locations on each of said substrates, wherein the defect location includes defect information;

at least two of a second tool selected from the group of inspection tool, metrology tool and a review tool;

the automation platform coupled to said interface said inspection tool, and to the at least two of the second tool, and operate to transfer substrates between the tools according to at least one escalation criterion, said automated platform being moveable to a plurality of stations and being operative to deliver and deposit a first wafer for inspection by one of said tools and operative during said inspection of said first wafer to simultaneously retrieve a second wafer; and an adjustment tool which adjusts the production line, wherein defect information is provided in real-time to allow adjustment of the production line to improve yield.

9. The cluster tool of claim 8, comprising an inspection tool a review tool of first sensitivity and a review tool of second sensitivity; the automation platform coupled to said interface, said inspection tool, and to the review tool of first sensitivity and to the review tool of second sensitivity, and transferring substrates between the tools according to at least one escalation criterion.

10. The cluster tool of claim 9, wherein said escalation criterion includes confidence level escalation criterion.

11. The cluster tool of claim 10, wherein said escalation criterion includes size-based escalation criterion.

12. The cluster tool of claim 8, wherein said testing of substrates in said tools is performed in a pipeline manner and wherein a single wafer cycle is obtained.

13. The cluster tool of claim 8, wherein said automation platform includes a track robot.

14. The cluster tool of claim 8, wherein said storage media being of a cassette type.

15. The cluster tool of claim 8, wherein said storage media being of a pod type.

16. The cluster tool of claim 8, wherein said inspection tool and at least one from among said second tools are accommodated within a common chamber.

17. The cluster tool of claim 8, wherein said automation platform is further coupled to at least one third tool selected from the group that includes overlay tool, macro tool and stepper track.

* * * * *